United States Patent [19]

Krimmel

[11] 4,140,546
[45] Feb. 20, 1979

[54] METHOD OF PRODUCING A MONOCRYSTALLINE LAYER ON A SUBSTRATE

[75] Inventor: Eberhard Krimmel, Pullach, Fed. Rep. of Germany

[73] Assignee: Siemens Aktiengesellschaft, Berlin & Munich, Fed. Rep. of Germany

[21] Appl. No.: 825,246

[22] Filed: Aug. 17, 1977

[30] Foreign Application Priority Data

Sep. 20, 1976 [DE] Fed. Rep. of Germany ....... 2644208

[51] Int. Cl.² .................... H01L 21/203; H01L 21/363
[52] U.S. Cl. ..................................... 148/1.5; 148/175; 148/183; 357/91; 427/86
[58] Field of Search ................ 148/175, 1.5, 183, 184; 427/86, 87; 357/91

[56] References Cited

U.S. PATENT DOCUMENTS

| | | | |
|---|---|---|---|
| 3,433,677 | 3/1969 | Robinson | 136/89 |
| 3,520,741 | 7/1970 | Mankarious | 148/175 |
| 3,614,423 | 10/1971 | Heynick et al. | 250/49.5 C |
| 3,808,674 | 5/1974 | Francombe et al. | 29/590 |
| 3,908,183 | 9/1975 | Ennis | 357/65 |
| 3,909,308 | 9/1975 | Heagy | 148/1.5 |
| 3,912,826 | 10/1975 | Kennedy | 427/8 |
| 3,924,136 | 12/1975 | Heynick et al. | 250/492 A |
| 3,997,368 | 12/1976 | Petroff et al. | 148/1.5 |
| 3,999,072 | 12/1976 | Takagi | 250/427 |
| 4,066,527 | 1/1978 | Takagi et al. | 204/192 N |

FOREIGN PATENT DOCUMENTS

7323599 7/1973 Japan .................................. 250/492 A

OTHER PUBLICATIONS

Matsunaga et al., "MBE With Ionized Dopant" Elec. Engg. Japan, 95 (1975) 28.
Naganuma et al., "Ionized Zn Doping of GaAs MBE Films", Appl. Phys. Letts. 27, (1975) 342.
Takagi et al., "Ionized Cluster Beam Deposition in Ion Impln. in S/C ed. S. Namba, Plenum Press, 1974.
Mattox, "Fundamentals of Ion Plating", 341, J. Vac. Sci. Tech. 10 (1973) 47.

Primary Examiner—L. Dewayne Rutledge
Assistant Examiner—Upendra Roy
Attorney, Agent, or Firm—Hill, Gross, Simpson, Van Santen, Steadman, Chiara & Simpson

[57] ABSTRACT

A monocrystalline layer is vapor-deposited on a substrate surface while substantially simultaneously such surface is irradiated with an ion beam having ions with a kinetic energy of at least 10 keV. The resultant ion current impinging on the substrate surface is controlled in such a manner that the sum of the vaporization rate and sputtering rate caused by such ions is smaller than the combined condensation rate of such ions and vaporized particles.

19 Claims, 2 Drawing Figures

METHOD OF PRODUCING A MONOCRYSTALLINE LAYER ON A SUBSTRATE

BACKGROUND OF THE INVENTION

1. Field of the Invention

The invention relates to a method of producing monocrystalline layers on a substrate.

2. Prior Art

Production of thin layer components, such as MOS components in semiconductor technology or IC components in SOS (silicon-on-sapphire) technology, etc., require processes whereby monocrystalline layers and/or a sequence of semiconductive layers can be deposited on a monocrystalline or an amorphous substrate. Known methods for producing such thin layers or such layer sequences generally comprise high-temperature processes in which a semiconductor material is epitaxial deposited on a substrate from a suitable gas phase or in which epitaxial deposition takes place on a seed from a liquid phase and large band or cylindrically shaped monocrystalline bodies are pulled therefrom and subsequently divided or disked into individual wafers or layers. Deposition of a thin layer from a gas phase may be accomplished by a so-called "ion plating" technique wherein a substrate to be coated with a layer is exposed to ion bombardment in order to cleanse the substrate surface, located within a suitable chamber which may be under vacuum. The material to be deposited as the layer is positioned in a crucible which is in working association with the cleansed substrate surface and upon energization of the crucible, the material therein is vaporized and precipitates or is deposited on the substrate surface. Ion bombardment may be maintained throughout the vapor-deposition process so as to improve adhesion between the deposited film and the substrate surface. Orientated growth of a so-deposited film may also be attained under these conditions (see "J. Vac. Sci. Technology", Vol. 10 (1973) pages 47-52). Since epitaxial growth proceeds via a seed or nuclei formation in such layers and subsequently proceeds as an orientated growth on such seeds, it is necessary in this "ion-plating" process to insure that a sufficient surface diffusion of the vaporized particles takes place on the substrate surface. In the prior art process, this is accomplished by utilizing a relatively high temperature on the substrate. Moreover, in most cases, this prior art process requires the use of a monocrystalline substrate which has a lattice structure similar to the lattice structure of the layer being grown so that an orientation is already determined during the nuclei formation. However, such high substrate temperatures are disadvantageous when, for example, the substrate per se is a semiconductor layer having dopant zones therein since dopant penetration and dopant peripheries are altered at high temperatures due to diffusion phenomena. Further, it is often times desirable to form layers on substrates which are not monocrystalline or have a lattice structure different from that of the layer being deposited.

SUMMARY OF THE INVENTION

The invention provides an improved method of producing a monocrystalline layer on a substrate, even at low temperatures and on amorphous substrates. In accordance with the principles of the invention, one or a sequence of monocrystalline layers are provided on a supporting base by vaporizing a material which is to form the layer or layers from a suitable source thereof and guiding such vapor flux to a surface of the supporting base while substantially simultaneously irradiating such surface with an ion flux having ions with a kinetic energy of at least 10 keV when impinging on the supporting base surface and controlling the resulting ion current so that the sum of the vaporization rate and the sputtering rate caused by such impinging ions is smaller than the combined condensation rate of such ions and vapor particles. In certain embodiments of the invention, the supporting base may be composed of a crystalline material, such as silicon or be composed of an amorphous material or be composed of a plastic or metallic film and such supporting base may be maintained at a temperature below about 400° C and preferably at about 200° C while the material being deposited may be the semiconductor, such as silicon and the ions within the impinging flux may be ions of the material being vapor-deposited or may contain dopant material ions therein. In certain embodiments of the invention, the ion current impinging on the substrate surface is maintained below about 10 mA cm$^{-2}$. In certain embodiments of the invention, an electrical field is maintained during the vapor deposition of the layer and in working association with the substrate surface so that the field has a component located in a plane containing the surface of the substrate upon which deposition occurs and in the specific form of this embodiment, an electrode, which may be a part of the substrate, is operationally positioned in close proximity to the surface of the substrate or supporting base so as to produce the desired electrical field. In another embodiment of the invention, a mechanical tension may be applied to at least the surface of the substrate upon which deposition occurs so that the so-produced tension has a component located in the plane containing the substrate surface. In certain embodiments of the invention, the ratio of the number of vapor particles impinging on the substrate surface to the number of impinging ions on such surface is controlled so as to be greater than about 10.

DESCRIPTION OF THE PREFERRED EMBODIMENTS

Figure 1:
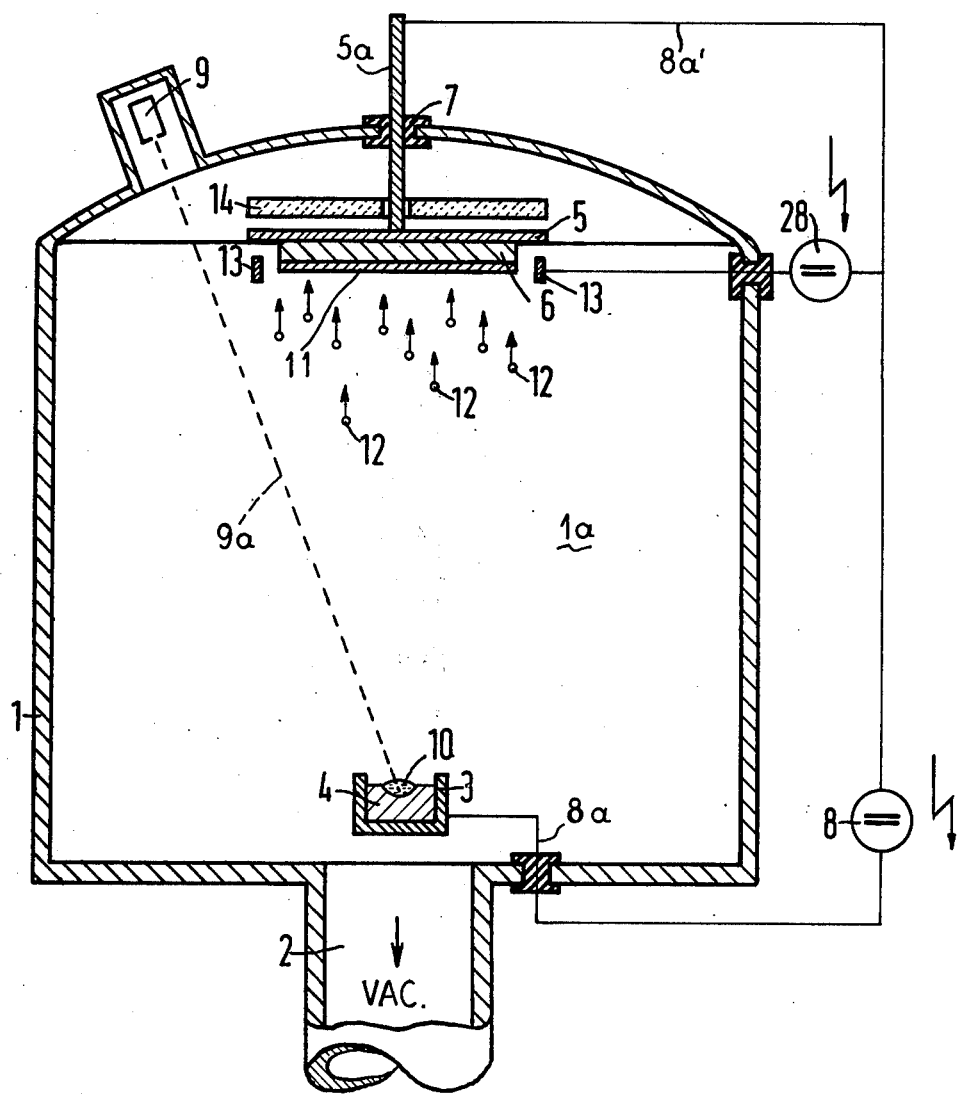
FIG. 1 is a partial elevated, somewhat schematic, view of an apparatus embodiment useful in the practice of the principles of the invention.

The invention provides a method of epitaxial growing a monocrystalline layer or a sequence of such layers on a substrate which may be crystalline or amorphous, even at relatively low substrate temperatures.

The principles of the invention provide a method, which in comparison to pertinent prior art methods, is particularly advantageous because relatively low substrate temperatures can be utilized so that undesired diffusion processes or crystal lattice effects in the substrate as well as in the grown layer are avoided. Relatively low substrate temperatures prevent the vapor-deposited material from again vaporizing or decomposing on the substrate surface. Further, mechanical forces, such as tension, which occur during cooling of a substrate and/or a grown layer after the growth process is completed and which induce crystal damage and disorder, are substantially eliminated by the practice of the principles of the invention.

The principles of the invention may be better understood from the following explanation. An epitaxial growth of a layer from vaporized particles takes place via an accumulation of such particles on nuclei or seeds. The resultant crystalline layer has an orientation if the seeds or nuclei on which accumulation took place themselves have an orientation. Such a seed orientation can be attained by an asymmetry of the crystal used as a substrate when such crystal is, for example, provided with a preferred orientated growth direction, as by means of mechanical tension for advancing desired seed formation. An orientation of seeds or nuclei or an orientated accumulation of such seeds may also be attained by providing a strong electrical field in the surface of such substrate. Such electrical field determines a preferred orientated growth direction. An electrical field positioned parallelly to the substrate surface may be formed when a seed on which accumulation takes place is very heavily electrically charged. In that case, a polarization field with very high field intensities is formed and because of such high electrical field, the surface diffusion toward the seeds does not proceed isotropically but rather in a preferred growth direction defined by such field. A suitable charging of seeds may also be attained when charged particles, for example ions, are irradiated onto the substrate surface simultaneously with the vaporization and deposition of the material forming the layer. Since surface irregularities and potentials are caused in the substrate surface by the impinging ions which alter the chemical potential of the substrate surface, an increased adhesive strength and an increased corrosion barrier are achieved for the material grown. This later characteristic is utilized in the earlier noted "ion plating" process wherein the substrate surface is simultaneously bombarded with noble gas ions and vapor particles during vapor deposition. However, no charge is imparted on seeds or nuclei formed on a substrate surface during this "ion-implanting" process. This is because the kinetic energies of the ions irradiated during such a process cannot exceed a specific magnitude because otherwise the vaporization caused by higher energy ions becomes greater than the accumulation of the vapor-deposited material. However, low energy ions produce low current densities which fail to produce a sufficiently high charge of the surface seeds.

In accordance with one preferred embodiment of the invention, an oriented seed or nuclei is achieved, and thus an orientated growth of a layer is obtained, by providing an electrical field in working association with the substrate surface so that a component of such field is located in the plane containing the substrate surface. Such an electrical field may be provided by positioning a grounded electrode in relatively close proximity to the substrate surface. Such a grounded electrode produces an electrical field between the heavily charged surface nuclei or seeds and the electrode. In this manner, a preferred orientated growth direction is defined. In accordance with another preferred embodiment of the invention, a preferred orientated growth direction is defined by forcing anisotropy on the substrate or supporting base with a mechanical tension, for example, a stretching. In these embodiments, the growth of a layer also proceeds on the seeds or nuclei located on the surface of the supporting base (which is now provided with a select tension) or the formation of such nuclei occurs with a select spatial orientation. This embodiment of the invention may be utilized not only with substrates composed of crystalline materials but also with substrates composed of amorphous materials, for example a substrate comprised of films or foils of inorganic or organic materials. In instances where films or the like are utilized as a substrate, such films may be processed through a suitable growth chamber by unwinding from a supply roll, pressure-guiding a segment of such film through the growth chamber, allowing the desired growth to take place and then rolling-up the so-treated film on a storage roller. In such an arrangement, a tensioning or stretching of the film can occur by control of the rotational velocity of the supporting rolls so that the desired preferred orientated growth direction is obtained in the surface of such a substrate. Further, a combination of these preferred embodiment may also occur whereby a substrate is provided with a preferred orientated growth direction by applying a mechanical tension and by positioning an appropriate electrode or superimposing an electrical field onto such substrate. In a preferred embodiment of the invention, an electron beam vaporizer means may be utilized to produce a vapor flux of the material being deposited and to produce an ion flux which contains ions composed of the material being vapor-deposited. This can be achieved by controlling properly the penetration depth of the electrons into the material being vaporized, since just a large penetration depth of electrons in a solid body causes a plasma channel to form: such a plasma channel contains a large number of ions which can be accelerated toward a substrate surface by applying an electric attraction or pulling voltage between the material source (i.e. crucible from which the material being vapor-deposited is vaporized) and the substrate or an elecrode associated therewith. The ratio between an ion flux and a vapor flux thus produced can be easily controlled by controlling the temperature of the material being so-ionized and/or vaporized. An adequate ion flux is attained, for example, with an electric attraction voltage of about 20 keV when the temperature of the material within a crucible is maintained relatively low. An adequate electrical current for use with an electron beam vaporizer means is about 10 mA per mm$^2$ of the heated area. However, other sources of material vapor which simultaneously produce ions may also be utilized in the practice of the invention. For example, a material source may be heated sufficiently to produce material vapors by a high frequency since the high frequency field produces ions on the basis of excitation effects.

Referring now to the drawings, wherein like reference numerals refer to like parts, FIG. 1 illustrates an exemplary embodiment of an apparatus useful in the practice of the principles of the invention. An enclosed housing 1, having a growth chamber 1a therein, is operationally coupled to a vacuum source (not shown) via a conduit 2. A crucible 3 is suitably positioned within the growth chamber 1a and provided with a suitable electrical high voltage feed through 8a for interconnecting, suited for high vacuum, the crucible 3 with a controllable high voltage source 8. A select material 4, such as silicon, is placed within the crucible 3. A support member 5 is positioned within the growth chamber 1a about the crucible 3. A substrate 6, for example composed of silicon, is mounted on the support member 5. The support member is provided with a high voltage feed through 5a with high vacuum seal 7. The feed through 52 is operationally coupled via electrical lead 8a' to the voltage source 8. An operational electron gun means 9 is mounted along a peripheral portion of the growth chamber 1a so as to have open communication with the material 4 within a crucible 3. Upon energization of the electron gun means 9, the material 4 within the crucible 3 is heated by electrons from the electron gun 9 and a liquid-melt zone 10 is formed within material 4 from which vapor particles emerge. The intensity of the electron beam 9a is controlled via suitable conventional means, and may be, for example 10 mA so as to provide electrons having a kinetic energy of about 5 keV. The material vaporized from melt zone 10, travels as a vapor, upwardly and is deposited on the surface of substrate 6 as a layer 11. Substantially simultaneously, ions 12 of the material 4, i.e. silicon ions in the exemplary embodiment here under discussion, are produced by the electron beam impinging on the liquid melt zone 10. Ions 12 are accelerated or drawn toward the surface of substrate 6 by applying a high voltage from source 8 between the crucible 3 and the support member 5. The voltage applied between the crucible and the support member is, for example, on the order of about 20 keV. The polarity of such applied voltage is such that the crucible 3 has a positive potential relative to the potential of the support member 5. The current density produced by ions 12 is, for example, about 5 mA per $cm^2$ of substrate surface. The current of ions so-produced effects an impulse and energy transfer and thus provides an orientated growth of layer 11, even during the nucleation phase thereof on the insulating substrate 6, which is under the influence of an electrical field. It will be noted that the substrate is not heated, as with the aid of a heating device, even though a heating means 14 may be provided in operational relation with the substrate to heat the substrate to a temperature below about 400° C and preferably to a temperature of about 200° C so that any damage caused by the ion stream may be annealed. Substantially no undesirable diffusion phenomena can occur in the substrate or between the substrate and the deposited layer 11 at such low temperatures, i.e. at 200° C. An auxiliary electrode 13 may be provided within the growth chamber 1a in close proximity to the substrate surface and be operationally coupled, by a feed through, to a controllable high voltage source 28a so that an electrical field is superimposed on the substrate surface having a component thereof in the plane containing such surface. Such an applied electrical field effects the orientated growth of seeds and matter accumulation in the growth of layer 11. In yet another embodiment of this apparatus, the electrode 13 may form a part of the support member 5 and, in that instance, has the potential of support member 5 so that voltage source 28 becomes superfluous.

Figure 2:
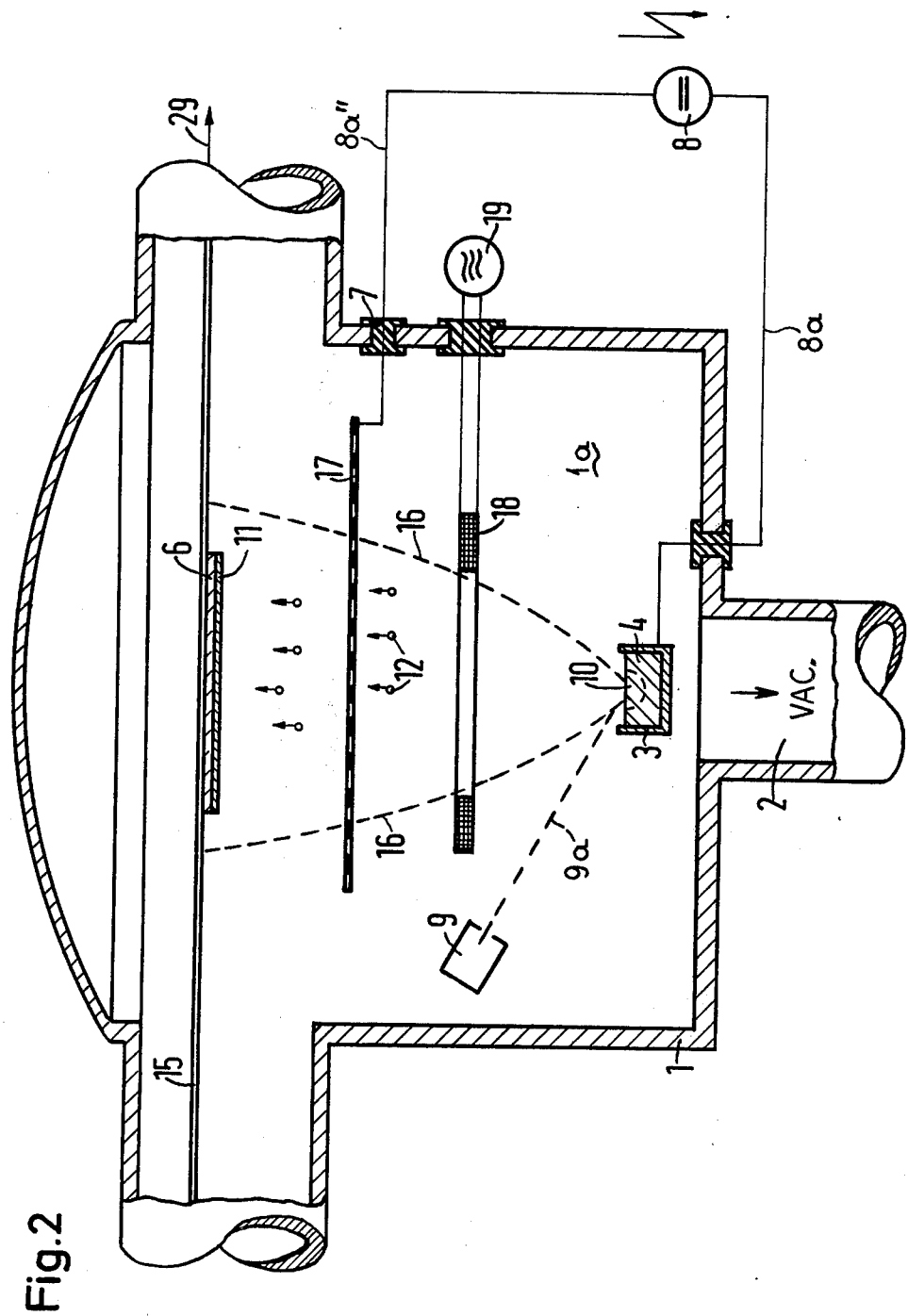
FIG. 2 is a somewhat similar view of another apparatus embodiment useful in the practice of the principles of the invention.

The exemplary embodiment illustrated at FIG. 2 is substantially similar to the apparatus shown at FIG. 1. In this embodiment, a controllably travelling band 15 functions as a support member for a substrate 6. The band 15 is operationally coupled with a drive means (not shown), such as rollers, so as to transport the substrate 6 into a cone-like area 16 of vapor particles travelling upwardly from a crucible 3. Ions 12, which are substantially simultaneously formed with the vapor particles via an electron gun means 9 (as explained in conjunction with FIG. 1) are accelerated to the substrate surface via a grid means 17 operationally coupled with a controllable voltage source 8 via an electrical conduit 8a". The grid means 17 is, as shown, positioned between the crucible 3 and the surface of substrate 6. A microwave antenna 18 may also be positioned in the space between the crucible 3 and the substrate 6 and be operationally coupled by a feed through to a microwave generator means 19. The high frequency electrical field produced by the microwave antenna can effect an additional ionization of the particles vaporized from source or zone 10 so that a higher current of ions is available for use in the practices of principles of the invention with this embodiment.

In a further embodiment of the invention, a film, such as 15, may comprise a substrate and a monocrystalline layer 11 may be directly grown on such film. A preferred orientated growth direction can be obtained in such a film by stretching the film, for example in the direction indicated by arrow 29.

As is apparent from the foregoing specification, the present is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is said forth and defined in the hereto appended claims.

I claim as my invention:

1. A method of producing at least one monocrystalline layer on a substrate surface, comprising:
    vaporizing a material which is to form said monocrystalline layer from a source thereof, condensing the so-attained vapor particles of such material on said substrate surface so as to form a layer of said material on said surface and maintaining an electrical field on said substrate surface during formation of said layer, said field having a component thereof located in the plane containing said substrate surface;
    substantially simultaneously impinging said substrate surface with an ion flux composed of ions having a kinetic energy of at least 10 keV upon impingement on said surface; and
    controlling the current of said ions impinging on said substrate surface in such a manner that the sum of the vaporization rate and sputtering rate caused by said ions is smaller than the combined condensation rate of said ions and vapor particles.

2. A method as defined in claim 1 wherein said substrate is composed of an insulating material.

3. A method as defined in claim 1 wherein said controlled current of ions impinging on said substrate surface is maintained at a value less than about 10 mA per $cm^2$ of substrate surface.

4. A method as defined in claim 1 wherein said ion flux is composed of ions of the material forming the layer on said substrate surface.

5. A method as defined in claim 1 wherein said electrical field is generated by an operational electrode positioned in close proximity to the surface of said substrate.

6. A method as defined in claim 1 wherein said substrate is an amorphous material.

7. A method as defined in claim 1 wherein said substrate is a film.

8. A method as defined in claim 1 wherein vaporization of said material is accomplished by heating a mass of said material within a crucible via an electron beam and a voltage of more than about 10 keV is applied between said crucible and said substrate.

9. A method as defined in claim 1 wherein vaporization of said material is accomplished by heating a mass of said material within a crucible via an electron beam and a voltage of more than about 10 keV is applied between said crucible and an operational electrode positioned in close proximity to said substrate.

10. A method as defined in claim 1 wherein a ratio of the number of vapor particles impinging on the surface of said substrate relative to the number of impinging ions is selected so as to be greater than about 10.

11. A method as defined in claim 1 wherein a plurality of layers, at least some of which are composed of a material different from the material of other layers, are formed one upon the other on said substrate surface.

12. A method as defined in claim 1 wherein said material is a semiconductor material.

13. A method as defined in claim 1 wherein said ion flux includes dopant material ions.

14. A method as defined in claim 1 wherein said substrate is maintained at a temperature below about 400° C during formation of said layer.

15. A method as defined in claim 1 wherein said substrate is maintained at a temperature of about 200° C during formation of said layer.

16. A method as defined in claim 5 wherein said electrode comprises a portion of said substrate.

17. A method of producing at least one monocrystalline layer on a substrate surface, comprising:

vaporizing a material which is to form said layer from a source thereof, condensing the so-attained vapor particles of such material on said substrate surface so as to form a layer of said material on said surface, and applying a mechanical tension to at least the surface of said substrate during the formation of said layer, said mechanical tension having a component thereof located in the plane containing the surface of said substrate;

substantially simultaneously impinging said substrate surface with an ion flux composed of ions having a kinetic energy of at least 10 keV upon impingement of said surface; and controlling the current of said ions impinging on said substrate surface in such a manner that the sum of the vaporization rate and sputtering rate caused by said ions is smaller than the combined condensation rate of said ions and vapor particles.

18. A method as defined in claim 17 wherein said mechanical tension is applied by stretching said substrate.

19. A method as defined in claim 12 wherein said semiconductor material is silicon.

* * * * *